(12) United States Patent
Cordero et al.

(10) Patent No.: US 8,692,561 B2
(45) Date of Patent: Apr. 8, 2014

(54) IMPLEMENTING CHIP TO CHIP CALIBRATION WITHIN A TSV STACK

(75) Inventors: Edgar R. Cordero, Round Rock, TX (US); Divya Kumar, Austin, TX (US); Anuwat Saetow, Austin, TX (US); Robert B. Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 411 days.

(21) Appl. No.: 13/207,688

(22) Filed: Aug. 11, 2011

(65) Prior Publication Data

US 2013/0038380 A1 Feb. 14, 2013

(51) Int. Cl.
*G01R 35/00* (2006.01)

(52) U.S. Cl.
USPC ............................................. 324/601; 327/524

(58) Field of Classification Search
USPC .................................................. 324/601, 600
See application file for complete search history.

(56) References Cited

U.S. PATENT DOCUMENTS

| | | | |
|---|---|---|---|
| 6,934,867 B2 | 8/2005 | Chen et al. | |
| 7,382,844 B2 | 6/2008 | Hwang et al. | |
| 7,475,366 B2 | 1/2009 | Kuemerle et al. | |
| 7,489,756 B2 | 2/2009 | Sidiropoulos | |
| 7,587,651 B2 | 9/2009 | Kuo et al. | |
| 7,643,954 B2 | 1/2010 | Cleitus et al. | |
| 7,721,135 B2 | 5/2010 | Lee et al. | |
| 7,728,619 B1 | 6/2010 | Tzou et al. | |
| 7,863,972 B2 | 1/2011 | Wang | |
| 2010/0045232 A1 | 11/2010 | Wang et al. | |
| 2010/0277210 A1* | 11/2010 | Wang et al. | ............ 327/147 |

OTHER PUBLICATIONS

"Self-calibrating transceiver for source synchronous clocking system with on-chip TDR and swing level control scheme" Jang, Young-Chan; Park, Joon-Young; Shin, Sungcheol; Choi, Hundae; Lee, Kyongsu; Woo, Byungsuk; Park, Hwanwook; Kim, Woo-Seop; Choi, Youngdon; Kim, Jaekwan; Kim, Hyun-Kyung; Kim, Jayoung; Lim, Suyoun; Chung, Su-Jin; Kim, Sora; Yoo, Jeihwan; Kim, Changhyun; VLSI Circuits, 2009 Symposium on; Publication Year: 2009, pp. 54-55.

"A 0.8-V accurately tuned linear continuous-time filter" Vemulapalli, G.; Hanumolu, P.K.; Youn-Jae Kook; Un-Ku Moon; Solid-State Circuits, IEEE Journal of Volume: 40, Issue: 9 Digital Object Identifier: 10.1109/JSSC.2005.848170.

IPCOM000143975D: "A Circuit and Associated Calibration Algorithm to Achieve DLL Remote Bias Sharing for Low Power Operations" Disclosed Anonymously; Dec. 13, 2006.

IPCOM000181418D: "An on Chip Calibration System using a VCO Based Comparator System" IBM; Apr. 1, 2009.

V. Zolotov, C. Viswewariah, J. Xiong. Voltage Binning Under Process Variation. 2009 IEEE/ACM International Conference on Computer-Aided Design Digest of Technical Papers, pp. 425-432.

* cited by examiner

*Primary Examiner* — Vincent Q Nguyen

(74) *Attorney, Agent, or Firm* — Joan Pennington

(57) ABSTRACT

A method and circuit for implementing a chip to chip calibration in a chip stack, for example, with through silicon vias (TSV) stack, and a design structure on which the subject circuit resides are provided. A first chip and a second chip are included within a semiconductor chip stack. The semiconductor chip stack includes a vertical stack optionally provided with Though Silicon Via (TSV) stacking of the chips. At least one of the first chip and the second chip includes a calibration control circuit and a performance indicator circuit coupled to the calibration control circuit to train and calibrate at least one of the first chip and the second chip to provide enhanced performance and reliability for the semiconductor chip stack.

20 Claims, 10 Drawing Sheets

PRIOR ART

PRIOR ART

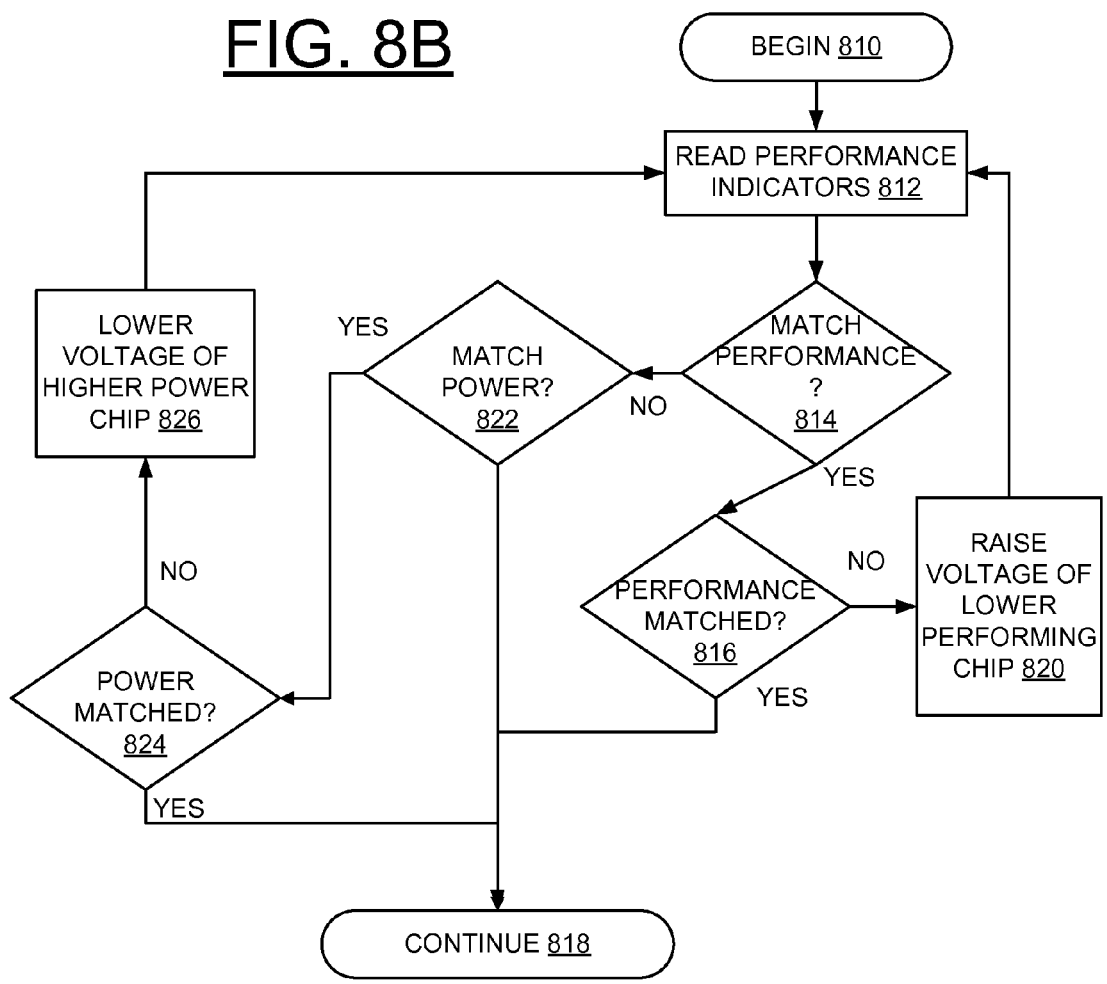

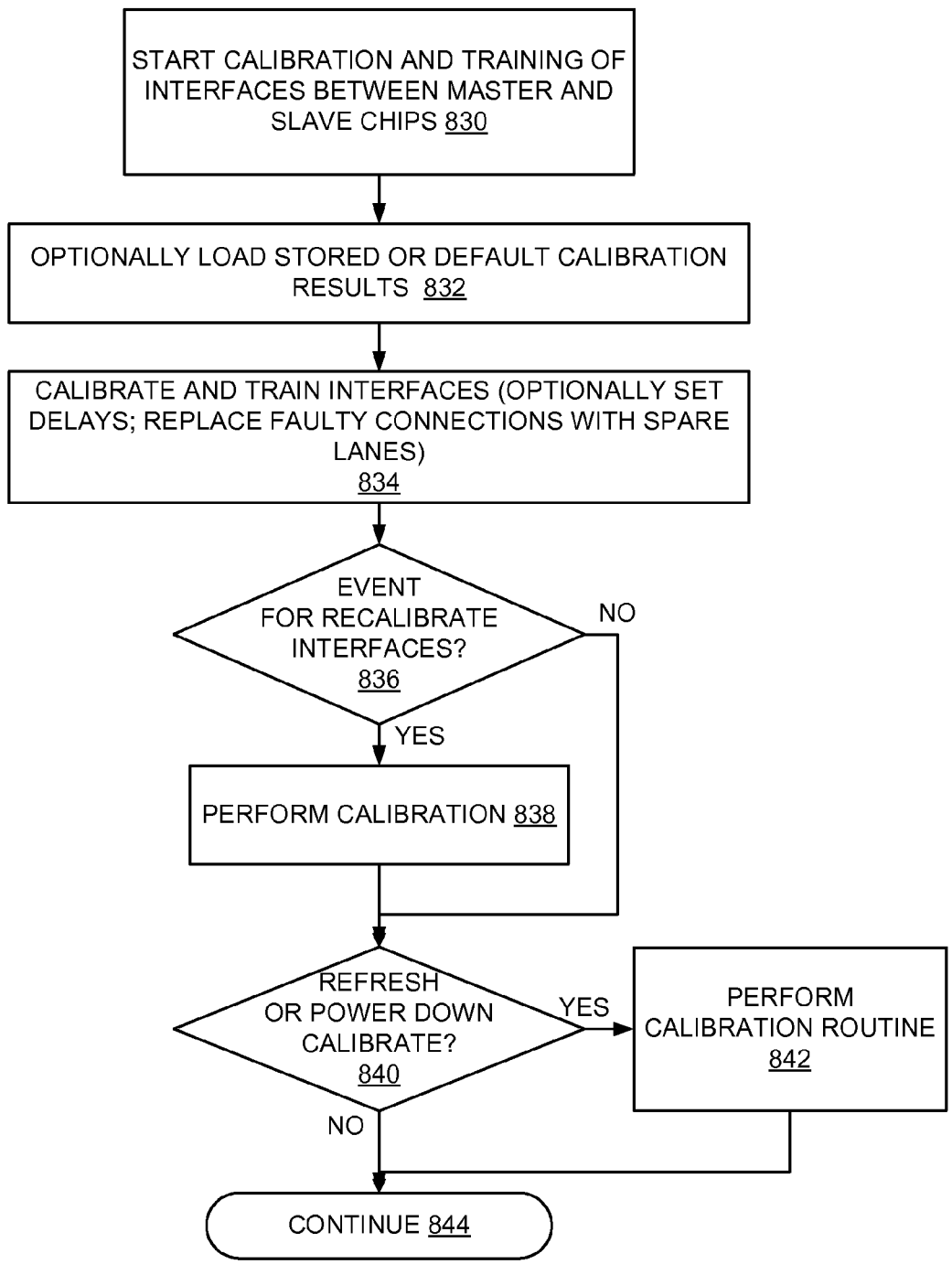

IMPLEMENTING CHIP TO CHIP CALIBRATION WITHIN A TSV STACK

FIELD OF THE INVENTION

The present invention relates generally to the data processing field, and more particularly, relates to a method and circuit for implementing a chip to chip calibration with through silicon vias (TSV) stack, and a design structure on which the subject circuit resides.

DESCRIPTION OF THE RELATED ART

In a system which connects two or more electrical components, such as semiconductor chips, the timing of the signals between the components may be critical. The timing properties which are important may be such things as clock period, clock duty cycle and signal to signal relative arrival times. These relationships and properties are particularly important in synchronous interfaces, such as clocked and/or strobed busses.

When two or more chips must operate using a synchronous interface, the performance of the subsystem comprised of the chips is limited by the lowest performing parts of the group. Performance of a semiconductor chip can be altered by modifying the voltage at which is set its power supply. If one of the chips of the subsystem is slower then the others, its voltage may be raised to compensate and therefore better match the performance of the faster chip or chips in the subsystem. Conversely, if power consumption is more important than performance, a faster performing chip's voltage can be lowered to take advantage of the unnecessary speed of that chip. This type of calibration allows the system to optimize power consumption versus performance where adjustments are possible.

An example of a strobed bus is the JEDEC-standard Double Data Rate three (DDR3) memory data bus. This bus requires a data strobe to accompany a bus of data in order to tell the receiver when it should perform its data capture. Capture of data and commands in any electrical bus includes a certain percentage of a usable data eye taken up with transition time on both the rising and falling edges that may exist around the time that the values are captured.

In FIG. 1, a prior art ideal data eye is shown where one or more data bits are arriving at the same time and the accompanying strobe is perfectly placed in the center of the eye. If the strobe is misplaced to either side of the center of the eye, either setup or hold timing margins will be affected. This misplacement can be such that the margin is consumed and the data can no longer effectively captured, as is shown in FIG. 2.

In all systems, it is desirable to maximize the data eye being captured in order to improve setup and hold time, and to center the capture of the data within the usable data eye. The ability to maximize this time is critical in improving how fast a particular signal, bus, or interface can operate.

To compensate for misalignments, such as the example shown in FIG. 2, delays can be placed on earlier arriving signals or delays can be removed from later arriving ones. In the case where there it is not possible to remove delays on later arriving signals, the only option is to delay the earlier ones.

Referring to FIG. 2, the strobe can be delayed until it is centered, similar to the example in FIG. 1. The process of moving signals in time is referred to as calibration or alignment. Calibration and alignment can be performed either manually, by the user, or through automatic techniques, such as with hardware or software algorithms.

Various methods can be used to control the arrival time of a signal, such as inserting delays in the signal path, changing the phase of the clocks controlling the signals' drivers and/or receivers or some combination of both.

In FIGS. 2 and 3, a single data bit using a single data strobe is shown. Another type of misalignment or need for calibration is when there is multiple data bits which use a common strobe, as shown in FIG. 3. In this case, the more skew between the data bits closes the effective data eye for the strobe and, therefore, reduces the available margin for the bus and increases the challenge of where to best place the strobe.

FIG. 4 illustrates prior art composite data eye with the multiple data bits of FIG. 3 which is smaller than ideal because the strobe must find a solution which is useable for all of the bits for its associated data. Calibration can be used to delay the earlier arriving bits, in order to better align the bits and compensate for deltas in such things as path lengths which can cause this type of skew.

FIG. 5 illustrates varying levels of skew and how it affects the effective data eye relative to ideal, which would be where all bits are perfectly aligned when overlaid. As can be seen in FIG. 5, aligning the bits of the bus creates a more robust interface by first presenting a larger data eye for the placement of the strobe and secondly increasing the margins which can allow for more variation at runtime from such factors as voltage and temperature that can further skew the interface.

A need exists for an effective mechanism for implementing a chip to chip calibration in a stack of semiconductor chips. It is desirable to provide such mechanism for implementing a chip to chip calibration of a dynamic random access memory (DRAM) including a master chip and a slave chip within the semiconductor chip stack.

SUMMARY OF THE INVENTION

Principal aspects of the present invention are to provide a method and circuit for implementing a chip to chip calibration with through silicon vias (TSV) stack, and a design structure on which the subject circuit resides. Other important aspects of the present invention are to provide such method, circuit, and design structure substantially without negative effects and that overcome many of the disadvantages of prior art arrangements.

In brief, a method and circuit for implementing a chip to chip calibration in a chip stack, for example, with through silicon vias (TSV) stack, and a design structure on which the subject circuit resides are provided. A first chip and a second chip are included within a semiconductor chip stack. The semiconductor chip stack includes a vertical stack optionally provided with Though Silicon Via (TSV) stacking of the chips. At least one of the first chip and the second chip includes a calibration control circuit and a performance indicator circuit coupled to the calibration control circuit to train and calibrate at least one of the first chip and the second chip to provide enhanced performance and reliability for the semiconductor chip stack.

In accordance with features of the invention, the calibration capability includes altering the operation of one chip in the stack to better match performance of another chip in the stack. For example, by altering the operational voltage of a chip, the operating speed the chip is changed. A higher voltage causes the chip to be able to be run at a higher frequency. A lower voltage causes the power consumed by the chip to be lowered.

Voltage control can be provided either through on-chip voltage regulators or through voltage regulators which are part of the system using the stack.

In accordance with features of the invention, the calibration capability includes capability to measure the performance indicators and capability to affect change in one or more of the chips in the stack. The calibration control circuit or circuits can be either on one or more of the chips of the stack and can be part of the system that is using the chip stack.

In accordance with features of the invention, the calibration logic samples the performance indicators of the chips of the TSV stack and compares them. Depending on the parameters to be matched, the calibration logic selectively raises or lowers the voltage control of either or both chips independently. Multiple factors affect the performance of the chips being adjusted, including for example voltage levels, process variation, temperature, intrinsic technology capability, jitter, noise, and position in the stack can add factors, such as temperature. Each such multiple factors affect the performance of the chips being adjusted to varying degree. For example, higher voltage increases the performance of the chip and allows the chip to better match the performance of the other chip. This is done when a chip is lower in performance than the other chips in the system or lower than the performance required to operate in the system. A lower voltage decreases the performance of the chip but also saves power. This is desirable if one chip is faster than required to operate in the system and can therefore sacrifice performance in order to lower power consumption.

In accordance with features of the invention, the calibration capability optionally includes calibration values identified at module testing and permanently stored in the semiconductor chip stack. Calibration optionally is performed on power up and initialization, and as part of runtime with real time continuous feedback to the calibration circuit, and chips and the respective chip to chip interfaces are calibrated and trained, for example, selectively using a combination of predetermined module test results, power up and initialization results, and results from run time calibrations.

In accordance with features of the invention, default calibration results are loaded into the semiconductor chip stack and then calibration is performed periodically during normal operation.

In accordance with features of the invention, the semiconductor chip stack optionally includes a dynamic random access memory (DRAM) module, and each of the DRAM master chip and DRAM slave chip include the calibration capability to compensate for variation in connecting paths between the DRAM master chip and DRAM slave chip.

In accordance with features of the invention, the semiconductor chip stack optionally includes a Field Programmable Gate Array, a static random access memory (SRAM) module, a flash memory, a phase change memory (PCM).

BRIEF DESCRIPTION OF THE DRAWINGS

The present invention together with the above and other objects and advantages may best be understood from the following detailed description of the preferred embodiments of the invention illustrated in the drawings, wherein:

FIGS. 8B, and 8C are flow charts illustrating exemplary sequential steps for implementing a chip to chip calibration with through silicon vias (TSV) stacking in accordance with the preferred embodiment.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
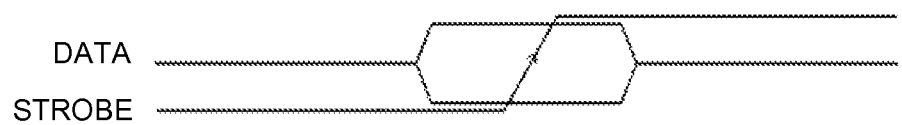
FIG. 1 illustrates a prior art data eye where one or more data bits are arriving at the same time and the accompanying strobe is perfectly placed in the center of the eye.
Figure 2:
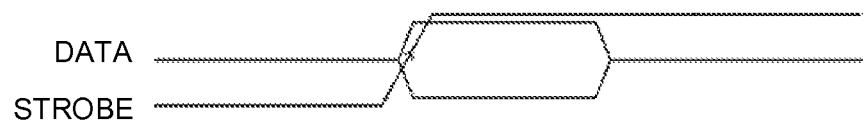
FIG. 2 illustrates a prior art ideal data eye with a non-centered strop where the strobe is misplaced to either side of the center of the eye, either setup or hold timing margins will be affected and the illustrated misplacement can be such that the margin is consumed and the data can no longer effectively captured.
Figure 3:
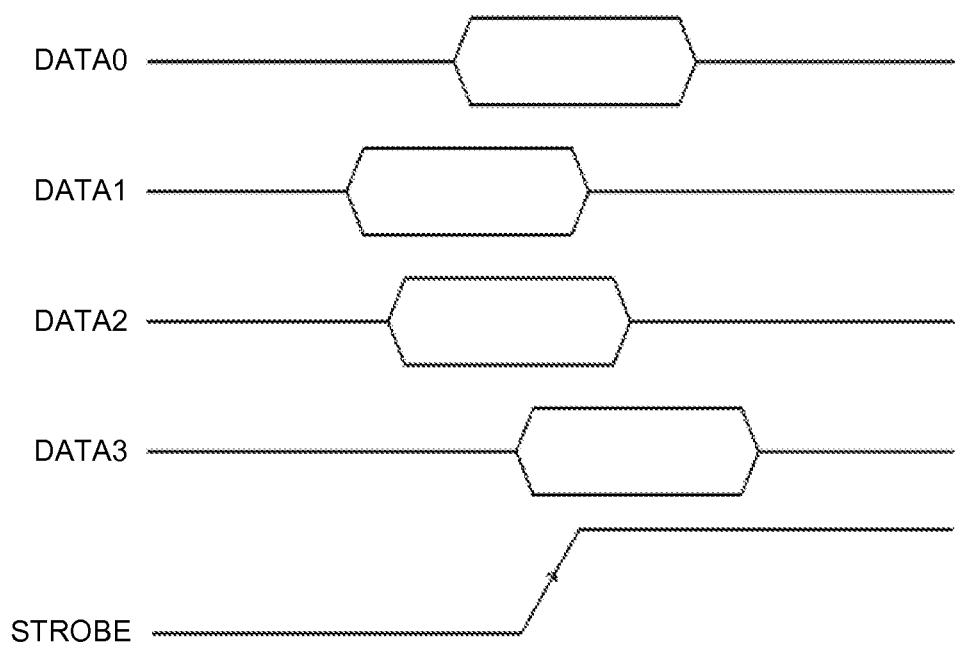
FIG. 3 illustrates prior art data eye with multiple data bits which use a common strobe.
Figure 4:
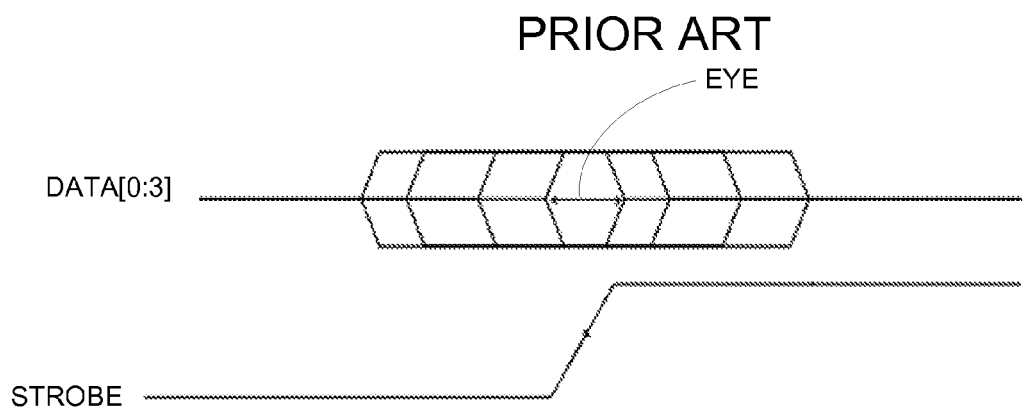
FIG. 4 illustrates prior art composite data eye with the multiple data bits of FIG. 3 which is smaller than ideal because the strobe must find a solution which is useable for all of the bits for its associated data.
Figure 5A:
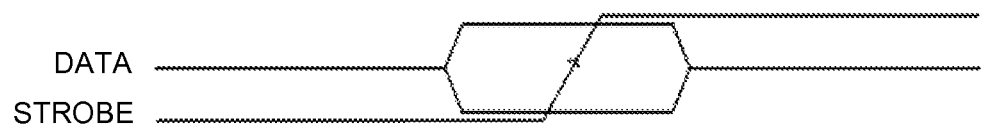
FIG. 5 illustrates varying levels of skew and how it affects the effective data eye relative to the ideal data eye.
Figure 5B:
Figure 5C:
Figure 6:
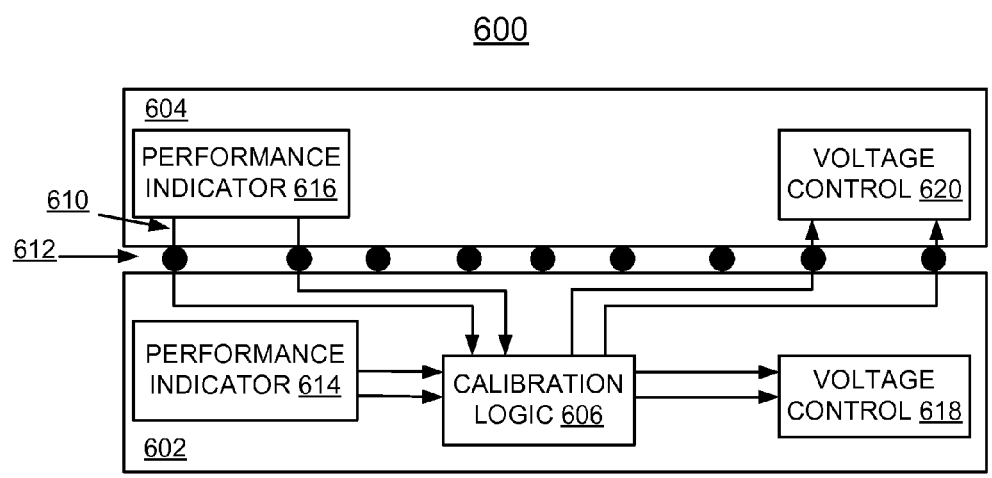
FIG. 6 schematically illustrates an exemplary circuit not to scale for implementing a chip to chip calibration with through silicon vias (TSV) stacking in accordance with the preferred embodiment.
Figure 7:
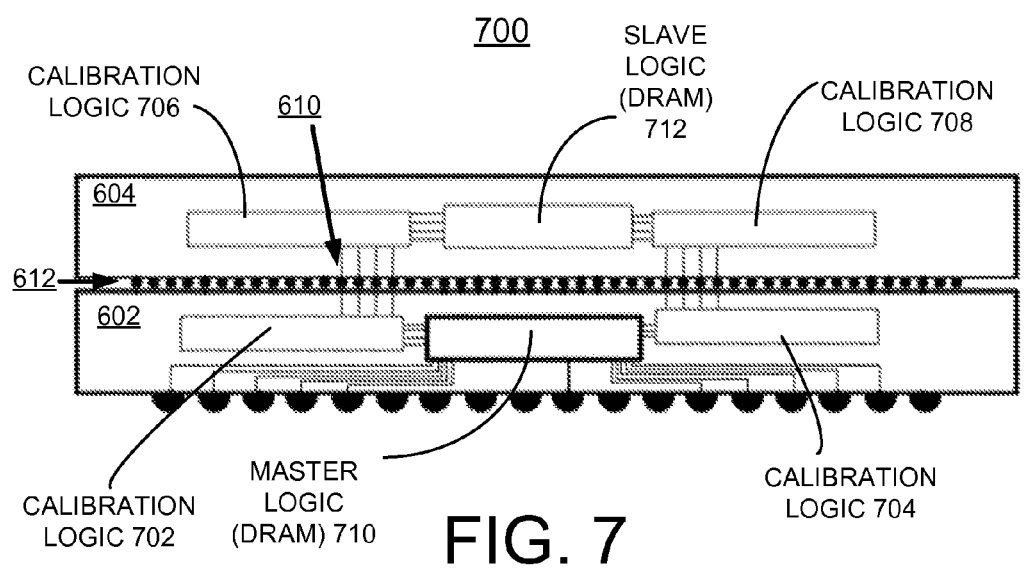
FIG. 7 schematically illustrates another exemplary circuit not to scale for implementing a chip to chip calibration with through silicon vias (TSV) stacking in accordance with the preferred embodiment.

In the drawings the same reference number are used in FIGS. 6-8 for identical or similar components or elements.

In accordance with features of the invention, a method and circuit for implementing a chip to chip calibration within through-silicon-via stacked semiconductor devices, and a design structure on which the subject circuit resides are provided. Through-Silicon-Via (TSV) or TSV interconnections, are widely used for various semiconductor chip stacking devices. Integrated circuit die stacking with packaging through silicon via (TSV) interconnections and other packaging techniques enable interconnecting die in ultra close proximity using the vertical dimension.

Having reference now to the drawings, in FIG. 6, there is shown an example circuit not to scale for implementing a chip to chip calibration within through silicon vias (TSV) stack generally designated by the reference character 600 in accordance with the preferred embodiment.

TSV stack circuit 600 includes a first or lower chip 602 and a second or upper chip 604. The chip 602 of TSV stack circuit 600 is a base layer semiconductor chip 602 which interfaces with a system board (not shown) as well as one or more chips, such as chip 604, in the layers above it. TSV stack circuit 600 also includes one or more layers of semiconductor chips which interface with the base chip 602 and other chips, such as chip 604.

The lower chip 602 includes calibration logic 606. TSV stack circuit 600 includes TSV interconnections or TSV stacking generally designated by the reference character 610. TSV stacking 610 allows for more signals to come from chips 602, 604 in the stack circuit 600 as compared to more conventional stacking methods. The calibration logic 606 receives inputs from a performance indicator 614 of chip 602, and a performance indicator 616 of chip 604. The calibration logic 606 selectively provides control inputs to a voltage control 618 of chip 602, and a voltage control 620 of chip 604.

TSV stack circuit 600 optionally includes, for example, a dynamic random access memory (DRAM) including a master chip 602 with master calibration logic 606 and a slave chip 604 within the semiconductor chip stack, as illustrated in FIG. 6. TSV stack circuit 600 optionally includes, for example, a Field Programmable Gate Array, a static random access memory (SRAM) module, a flash memory, a phase change memory (PCM).

Through silicon vias (TSV) stacking, or 3D stacking 610, is used to stack semiconductor chips 602, 604. TSV stacking 610 creates signal interfaces generally designated by the reference character 612 for the signals which travel from one layer, such as chip 602 of the stack to another layer or chip 604.

The signals coming from the upper chips, such as chip 604 of the TSV stack circuit 600 to the lowest chip 602 can either be passed directly through to the system board or intercepted by the bottom chip. In the case where signals pass from each chip in the stack to the system, signals can be calibrated by the system directly. Alternatively, as in a master-slave configuration, only the signals from the bottom chip 602 in the stack are accessible by the system. In this case, calibrations done directly by the system are not possible. As with signals on the system board, signals going from chip 602 to chip 604 in the TSV stack 610 may not be optimally aligned, because of such things as varying layout of signals, which reduces the potential performance of the stack circuit 600 as well as its margin.

TSV circuit 600 implements a calibration algorithm for the chips 602, 604, for example, to better align the interfaces 612 between them in the TSV stack 610. The calibration logic 606 of chip 602 provides the ability to train and calibrate chips 602 and 604, and their respective signal interfaces 612 in order to reach higher performance and reliability. Each of the chips 602, 604 respectively includes the respective performance indicator 614, 616 providing a critical path monitor and a performance monitor for the chips 602, 604 and signal interfaces 612 and the respective voltage control 618, 620 enable matching performance and matching power of the chips 602, 604.

The performance indicators 614, 616 on respective chips 602, 604 can either be single to represent the entire chip or multiple ones can be used to compare or measure different portions of the chip. Multiple performance indicators 614, 616 on each chip 602, 604 would allow for more localized adjustment and better customization or an averaging could be done on their measurements in order to achieve a better view of the overall chip then could be achieved with a single indicator.

Examples of the respective performance indicator 614, 616 include a delay line, phase rotators or digital locked loop. For example, a signal is inserted into a circuit of serial delay elements. By sampling tap points at each of the outputs of each delay element and comparing the signal at that point to the original signal, the propagation delay of the delay elements can be measured. The number of delay elements required to achieve a certain relationship between the tap point signal and that of the original signal is the sought after performance indicator. A lower number of these delay elements indicates slower delay elements than a chip that has a higher number. The relative speed between the delay elements could be from process differences or voltage levels.

The calibration capability of the chips 602, 604 includes capability to measure the performance indicators 614, 616 and capability to affect change in one or more of the chips in the stack, for example, using one or more of the voltage controls 618, 620. The calibration control circuit or circuits can be either on one or more of the chips 602, 604 of the stack and can be part of the system that is using the chip stack.

In accordance with features of the invention, the master calibration logic 606 samples the performance indicators 614, 616 of the chips 602, 604 of the TSV stack circuit 600 and compares them. Depending on the parameters to be matched, the calibration logic 606 selectively raises or lowers the voltage control 618, 620 of either or both chips 602, 604 independently. The voltage levels affect the performance of the chips 602, 604 being adjusted. For example, higher voltage increases the performance of one of the chips 602, 604 and allows the chip, such as chip 602 to better match the performance of the other chip 604. This is done when a chip is lower in performance than the other chips in the system or lower than the performance required to operate in the system. A lower voltage decreases the performance of the chip but also saves power. This is desirable if one chip is faster than required to operate in the system and can therefore sacrifice performance in order to lower power consumption.

In accordance with features of the invention, the calibration capability includes altering the operation of one chip in the stack to better match performance of another chip in the stack. For example, by altering the operational voltage of a chip with one of the respective voltage controls 618, 620, the operating speed the chip is changed. A higher voltage causes the chip to be able to be run at a higher frequency. A lower voltage causes the power consumed by the chip to be lowered. Voltage control can be provided either through on-chip voltage regulators or through voltage regulators which are part of the system using the stack.

Another way to affect the behavior of the chips is to insert or remove delays on signals of the respective performance indicator 614, 616. The timing relationships of signals, either chip to chip or within a chip, are important for the correct operation of the circuits which use them. By delaying earlier arriving signals or reducing delays on later arriving signals, interfaces can be aligned to improve their operation. When multiple chips are assembled into a TSV stack, differences between them can cause their common interfaces to not operate correctly. In order to match the chip interfaces, delays can be adjusted on the signals that make up the interface. These delays can better align the interface and increase the performance dramatically In accordance with features of the invention, a calibration function of TSV circuit 600 is used to align signals which go from chip-to-chip 602, 604 in the TSV stack 610 at respective interfaces 612. By using calibration, the performance and reliability of the TSV circuit 600 is increased.

Referring to FIG. 7, there is shown another exemplary circuit not to scale for implementing a chip to chip calibration with through silicon vias (TSV) stacking generally designated by the reference character 700 in accordance with the preferred embodiment. TSV circuit 700 includes the first chip 602 and the second chip 604, TSV stack 610, and respective signal interfaces 612, such as shown in TSV circuit 600 of FIG. 6. A calibration function of TSV circuit 700 similarly is used to match performance, match power, and align signals which go from chip-to-chip 602, 604 in the TSV stack 610 at respective interfaces 612.

In TSV circuit 700, chip 602 includes calibration logic 702 and calibration logic 704 coupled to the master calibration logic 606. Chip 604 includes calibration logic 706 and calibration logic 708 coupled to the slave logic 608 and respectively coupled to the calibration logic 702 and calibration logic 704. The respective calibration logic 702, 704 and/or calibration logic 706, 708 optionally contains sparing logic which is used to replace faulty signals from the interface with spare lanes which are better performing, which otherwise may hamper proper operation of the stack TSV circuit 700. In TSV circuit 700, chip 602 includes master logic 710, and chip 604 includes slave logic 712, such as in a dynamic random access memory (DRAM) module.

TSV circuit 700 uses calibration so that the performance and reliability of the TSV circuit 600 is increased. For example, each chip 602, 604 has one or more circuits 702, 704; 706, 708 or sense points which indicate the relative process speed of the chip. These measurement points give an indication of how matched performance could be obtained while retaining proper functioning of the chip 602, 604. These points are measured by one or more calibration circuits and compared to those on the other chip 602, 604. Should performance be the primary goal, the calibration circuit would then increase the voltage used by the slower of the chips in order to increase their performance. If power is of higher concern, then the voltage of the faster chips would be lowered in order to match the performance of the slower chips and therefore reduce the power consumed. The voltages could be controlled by such means as a voltage regulator local to each chip.

The first and second chips 602, 604 optionally are operating with a synchronous bus between the chips at the respective interfaces 612. For example, a clocked signal is coupled between the chips 602, 604 which is used by the calibration control logic 702, 704, 706, 708 of one or both of the chips in order to compensate for differences in the local and received clocks. This compensation aligns the separate clock domains so that the synchronous bus at the respective interfaces 612 between the chips 602, 604 can operate more reliably.

In TSV circuit 700, chips 602, 604 in the stack have signals which pass to and/or through each other. These signals optionally are intercepted at the receivers or pre-skewed before launch at the drivers and calibrated by the respective calibration logic 702, 704 of chip 602 and the respective calibration logic 706, 708 of chip 604. This configuration allows for a maximum control of the calibration algorithm, for example, as illustrated and described with respect to FIGS. 8B, and 8C.

Figure 8A:
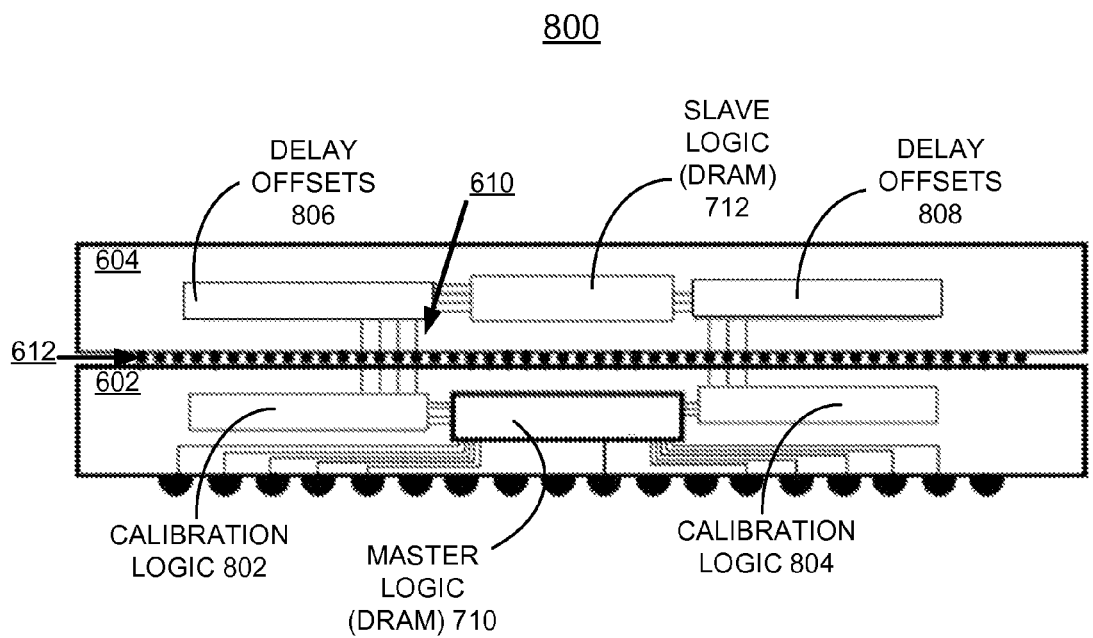
FIG. 8A schematically illustrates another exemplary circuit not to scale for implementing a chip to chip calibration with through silicon vias (TSV) stacking in accordance with the preferred embodiment.

Referring to FIG. 8A, there is shown another exemplary circuit not to scale for implementing a chip to chip calibration with through silicon vias (TSV) stacking generally designated by the reference character 800 in accordance with the preferred embodiment. TSV circuit 800 includes the first chip 602 and the second chip 604, TSV stack 610, and respective signal interfaces 612, such as shown in TSV circuit 600 of FIG. 6. Chip 602 includes master logic 710, and chip 604 includes slave logic 712, such as in a dynamic random access memory (DRAM) module, as shown in TSV circuit 700 of FIG. 7. A calibration function of TSV circuit 800 similarly is used to align signals which go from chip-to-chip 602, 604 in the TSV stack 610 at respective interfaces 612.

In TSV circuit 800, chip 602 includes calibration logic 802 and calibration logic 804 coupled to the master logic 710. Chip 604 includes delay offsets 806 and delay offsets 808 coupled to the slave logic 712 and respectively coupled to the calibration logic 802 and calibration logic 804. The respective calibration logic 802, 804 optionally contains sparing logic which is used to replace faulty signals from the interface which may hamper proper operation of the stack TSV circuit 800 with spare lanes which are better performing.

In TSV circuit 800, once calibration is completed, for example, using respective calibration logic 802, 804 of chip 602, the appropriate calculated delays 806, 808 of the slave chip 604 are loaded by the master chip 602. TSV circuit 800 reduces the logic required by the slave chip 604.

Referring to FIG. 8B, there are shown exemplary sequential steps for implementing a chip to chip calibration with through silicon vias (TSV) stacking in accordance with the preferred embodiment starting at a block 810. As indicated at a block 812, the calibration logic reads the Performance Indicators, such as performance indicators 614, 616 of FIG. 6.

If it is desired to match the performance of the chips 602, 604, the values attained from reading the performance indicators are compared as indicated at a decision block 814. If the performance indicators match as indicated at a decision block 816, the flow is complete as indicated at a block 818.

If the performance indicators do not match, the voltage of the lower performing chip is raised as indicated at a block 820 and the calibration logic repeats the flow, starting with re-reading the performance indicators at block 812. These steps will be repeated until the performance matching has been satisfied.

Similarly, if power reduction is of concern, the performance monitors are compared as indicated at decision blocks 822, and 824 and the higher performing chip has its voltage lowered until the correct performance is achieved as indicated at a block 826.

Referring to FIG. 8C, there are shown exemplary sequential steps for implementing a chip to chip calibration with through silicon vias (TSV) stacking in accordance with the preferred embodiment. As indicated at a block 810, calibration and training of interfaces between master and slave chips start. For example, on power up and initialization, the master chip 602 would, either on its own or after being commanded to by a system controller, calibrate and train the interfaces 612 between the master and slave chips 602, 604. At module test, calibration results advantageously are detected and compensating settings optionally are burned into fuses so the default resulting values are stored permanently in the module or TSV circuit 600, 700, 800 and loaded when the TSV circuit is powered on/taken out of reset.

As indicated at a block 812, stored or default calibration results optionally are loaded. Default calibration results could be loaded into the TSV circuit 600, 700, 800 from when it was manufactured and then re-calibrated in the field, such as at power on to achieve more accurate results which may vary from the factory settings because of power and temperature variations present in the TSV circuit.

Next as indicated at a block 814, interfaces 612 between the master and slave chips 602, 604 are calibrated and trained. Optionally delays are set in the slave chip such as in TSV circuit 800. Optionally the calibration logic contains sparing logic which is used to replace faulty signals from the respective interfaces which may hamper proper operation of the stack TSV circuit with lanes which are better performing at block 814.

Checking for an event for recalibrating interfaces is performed as indicated at a decision block 816. For example, during runtime calibration optionally is periodically implemented with the system to regularly request that the calibration be reperformed, either in an abbreviated or full manner as indicated at a block 818. For example, recalibrating interfaces is performed at a timed interval or when system environmental conditions suggest a calibration may be required at block 818.

Checking for refresh or power down option for recalibrating interfaces is performed as indicated at a decision block 820. Calibration optionally is redone upon exiting or entering a self-timed refresh or power down state, such as where it is known the DRAM stack would not be accessed as indicated at a block 822. Operations continue as indicated at a block 824.

Figure 9:
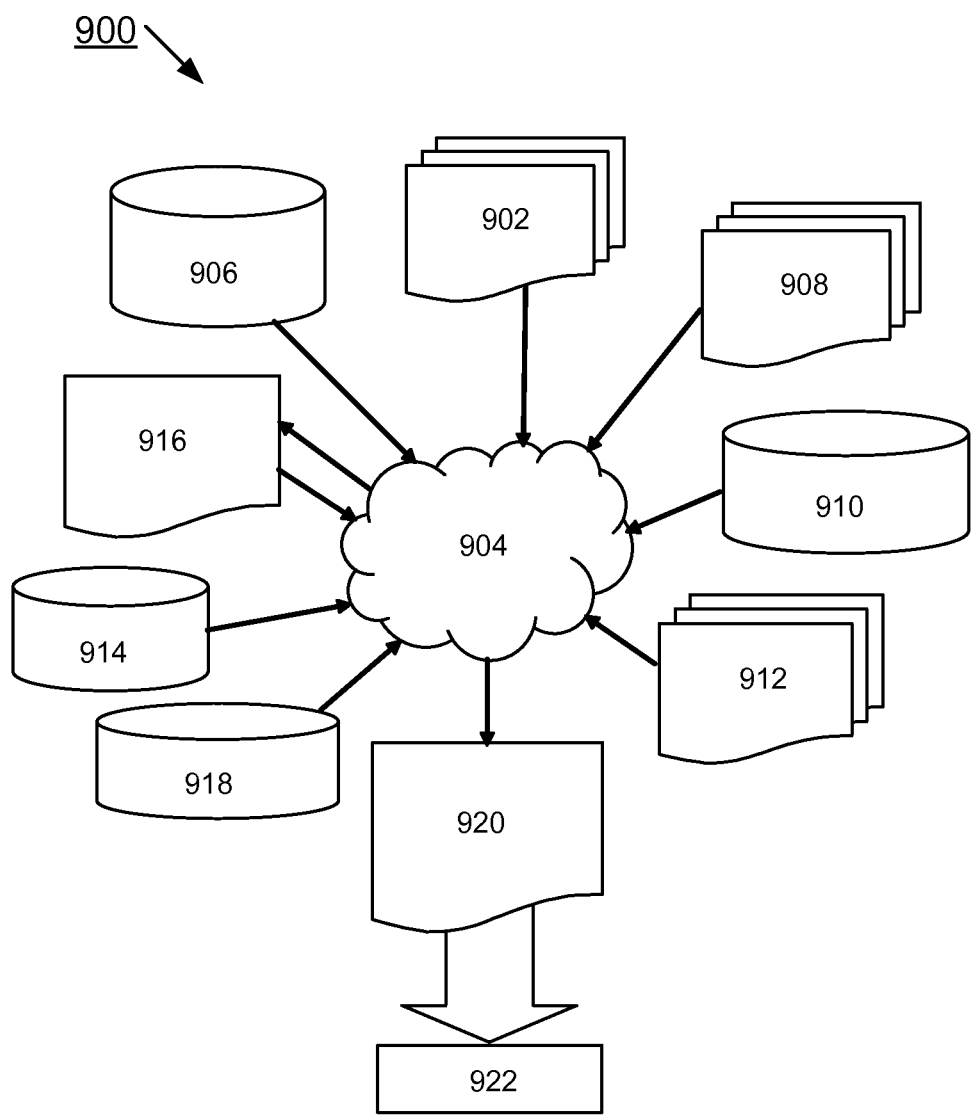
FIG. 9 is a flow diagram of a design process used in semiconductor design, manufacturing, and/or test.

FIG. 9 shows a block diagram of an example design flow 900. Design flow 900 may vary depending on the type of IC being designed. For example, a design flow 900 for building an application specific IC (ASIC) may differ from a design flow 900 for designing a standard component. Design structure 902 is preferably an input to a design process 904 and may come from an IP provider, a core developer, or other design company or may be generated by the operator of the design flow, or from other sources. Design structure 902 comprises circuit 600, circuit 700 and circuit 800 in the form of schematics or HDL, a hardware-description language, for example, Verilog, VHDL, C, and the like. Design structure 902 may be contained on one or more machine readable medium. For example, design structure 902 may be a text file or a graphical representation of circuit 600, circuit 700 and circuit 800. Design process 904 preferably synthesizes, or translates, circuit 600, circuit 700 and circuit 800 into a netlist 906, where netlist 906 is, for example, a list of wires, transistors, logic gates, control circuits, I/O, models, etc. that describes the connections to other elements and circuits in an integrated circuit design and recorded on at least one of machine readable medium. This may be an iterative process in which netlist 906 is resynthesized one or more times depending on design specifications and parameters for the circuit.

Design process 904 may include using a variety of inputs; for example, inputs from library elements 908 which may house a set of commonly used elements, circuits, and devices, including models, layouts, and symbolic representations, for a given manufacturing technology, such as different technology nodes, 32 nm, 45 nm, 90 nm, and the like, design specifications 910, characterization data 912, verification data 914, design rules 916, and test data files 918, which may include test patterns and other testing information. Design process 904 may further include, for example, standard circuit design processes such as timing analysis, verification, design rule checking, place and route operations, and the like. One of ordinary skill in the art of integrated circuit design can appreciate the extent of possible electronic design automation tools and applications used in design process 904 without deviating from the scope and spirit of the invention. The design structure of the invention is not limited to any specific design flow.

Design process 904 preferably translates an embodiment of the invention as shown in FIGS. 6, 7, 8A and 8B along with any additional integrated circuit design or data (if applicable), into a second design structure 920. Design structure 920 resides on a storage medium in a data format used for the exchange of layout data of integrated circuits, for example, information stored in a GDSII (GDS2), GL1, OASIS, or any other suitable format for storing such design structures. Design structure 920 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 6, 7, 8A and 8B. Design structure 920 may then proceed to a stage 922 where, for example, design structure 920 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing a chip to chip calibration with through silicon vias (TSV) stack comprising:
   a first chip;
   a second chip and said first chip in a vertical semiconductor chip stack of the semiconductor chips;
   at least one of the first chip and the second chip including a calibration control circuit, and a performance indicator circuit coupled to said calibration control circuit;
   at least one of the first chip and the second chip being trained and calibrated to provide enhanced performance and reliability of the semiconductor chip stack.

2. The circuit as recited in claim 1 wherein at least one of the first chip and the second chip including a calibration control circuit, and a performance indicator circuit coupled to said calibration control circuit includes at least one of the first chip and the second chip having calibration logic with control of a coupling signal for at least one of the chips in the semiconductor chip stack.

3. The circuit as recited in claim 1 wherein at least one of the first chip and the second chip including a calibration control circuit, and a performance indicator circuit coupled to said calibration control circuit includes at least one of the first chip and the second chip having calibration logic for measuring a clock of another chip and adjusting a clock of at least one of the first chip and the second chip.

4. The circuit as recited in claim 1 wherein at least one of the first chip and the second chip including a calibration control circuit, and a performance indicator circuit coupled to said calibration control circuit includes each of the first chip and the second chip having performance indicators and a voltage control for selectively raising or lowering a voltage of one of the chips in the semiconductor chip stack.

5. The circuit as recited in claim 1 wherein at least one of the first chip and the second chip including a calibration control circuit, and a performance indicator circuit coupled to said calibration control circuit includes each of the first chip and the second chip having performance indicators and at least one of the first chip and the second chip having calibration logic.

6. The circuit as recited in claim 1 wherein at least one of the first chip and the second chip including a calibration control circuit, and a performance indicator circuit coupled to said calibration control circuit includes sparing logic used to identify and replace faulty signals from each respective chip to chip interface.

7. The circuit as recited in claim 1 wherein at least one of the first chip and the second chip including a calibration control circuit, and a performance indicator circuit coupled to said calibration control circuit includes delay offsets providing said calibration capability.

8. The circuit as recited in claim 1 includes a dynamic random access memory (DRAM) module, and at least one of a DRAM master chip and a DRAM slave chip including a calibration control circuit, and a performance indicator circuit coupled to said calibration control circuit to compensate for variation in connecting paths between the DRAM master chip and DRAM slave chip.

9. The circuit as recited in claim 1 wherein at least one of the first chip and the second chip including a calibration control circuit, and a performance indicator circuit coupled to said calibration control circuit includes said performance indicator circuit selectively measuring at least one of critical path monitor, temperature, signal alignment, and dynamic random access memory (DRAM) access latency.

10. The circuit as recited in claim 1 wherein vertical semiconductor chip stack includes a through silicon vias (TSV) stack.

11. A design structure embodied in a machine readable medium used in a design process, the design structure comprising:
   a circuit tangibly embodied in the machine readable medium used in the design process, said circuit for implementing a chip to chip calibration, said circuit comprising:
   a first chip;
   a second chip and said first chip in a vertical semiconductor chip stack of the semiconductor chips;
   at least one of the first chip and the second chip includes a calibration control circuit, and a performance indicator circuit coupled to said calibration control circuit;
   at least one of the first chip and the second chip being trained and calibrated to provide enhanced performance and reliability of the semiconductor chip stack wherein the design structure, when read and used in the manufacture of a semiconductor chip produces a chip comprising said circuit.

12. The design structure of claim 11, wherein the design structure comprises a netlist, which describes said circuit, and wherein the design structure resides on storage medium as a data format used for the exchange of layout data of integrated circuits, and wherein the design structure includes at least one of test data files, characterization data, verification data, or design specifications.

13. The design structure of claim 11, wherein said circuit includes a dynamic random access memory (DRAM) module, and each of a DRAM master chip and DRAM slave chip including a calibration control circuit to compensate for variation in connecting paths between the DRAM master chip and DRAM slave chip.

14. The design structure of claim 11 includes each respective chip to chip interface being periodically calibrated during normal operation.

15. A method for implementing a chip to chip calibration including a first chip and a second chip in a semiconductor chip stack, said method comprising:
   providing a vertical stack of the semiconductor chip stack of the semiconductor chips;
   providing at least one of the first chip and the second chip with a calibration control circuit, and a performance indicator circuit coupled to said calibration control circuit; and
   training and calibrating at least one of the first chip and the second chip to provide enhanced performance and reliability of the semiconductor chip stack.

16. The method as recited in claim 15 wherein providing at least one of the first chip and the second chip with a calibration control circuit, and a performance indicator circuit coupled to said calibration control circuit includes providing calibration logic to compensate for variation in connecting paths between the first chip and the second chip.

17. The method as recited in claim 15 wherein providing at least one of the first chip and the second chip with a calibration control circuit, and a performance indicator circuit coupled to said calibration control circuit includes providing calibration logic to sensing performance indicators, and selectively raises or lowers a voltage control of one of the chips in the semiconductor chip stack.

18. The method as recited in claim 15 wherein providing at least one of the first chip and the second chip with calibration control circuit, and a performance indicator circuit coupled to said calibration control circuit includes providing calibration logic sensing performance indicators and performing calibration delay offsets.

19. The method as recited in claim 15 includes sensing performance indicators and performing calibration on power up or initialization, or on a self-timed refresh or power down state.

20. The method as recited in claim 15 wherein providing at least one of the first chip and the second chip with calibration capability includes providing sparing logic used to identify and replace faulty signals from the respective chip to chip interface.

* * * * *